United States Patent
Ryo et al.

(10) Patent No.: US 9,281,194 B2
(45) Date of Patent: Mar. 8, 2016

(54) FABRICATION METHOD OF SILICON CARBIDE SEMICONDUCTOR APPARATUS

(71) Applicant: FUJI ELECTRIC CO., LTD., Kawasaki-shi, Kanagawa (JP)

(72) Inventors: Mina Ryo, Tsukuba (JP); Shinichi Nakamata, Tsukuba (JP); Akimasa Kinoshita, Tsukuba (JP); Kenji Fukuda, Tsukuba (JP)

(73) Assignee: FUJI ELECTRIC CO., LTD., Kawasaki-shi (JP)

( * ) Notice: Subject to any disclaimer, the term of this patent is extended or adjusted under 35 U.S.C. 154(b) by 0 days.

(21) Appl. No.: 14/390,715

(22) PCT Filed: Mar. 18, 2013

(86) PCT No.: PCT/JP2013/057741
§ 371 (c)(1),
(2) Date: Oct. 3, 2014

(87) PCT Pub. No.: WO2013/150889
PCT Pub. Date: Oct. 10, 2013

(65) Prior Publication Data
US 2015/0194313 A1    Jul. 9, 2015

(30) Foreign Application Priority Data

Apr. 6, 2012  (JP) ................................. 2012-087726

(51) Int. Cl.
*H01L 21/04* (2006.01)
*H01L 21/02* (2006.01)
(Continued)

(52) U.S. Cl.
CPC ...... *H01L 21/0485* (2013.01); *H01L 21/02529* (2013.01); *H01L 21/02636* (2013.01);
(Continued)

(58) Field of Classification Search
CPC ............ H01L 21/0485; H01L 21/2855; H01L 29/66143; H01L 29/1608; H01L 21/02529; H01L 21/02636; H01L 29/6606; H01L 29/45; H01L 29/401; H01L 21/285; Y10S 438/931
USPC .......................... 438/478; 257/77; 204/298.13
See application file for complete search history.

(56) References Cited

U.S. PATENT DOCUMENTS

2006/0273323 A1  12/2006 Yamamoto et al.
2011/0207321 A1   8/2011 Fujiwara et al.
2013/0032477 A1   2/2013 Yamakoshi et al.

FOREIGN PATENT DOCUMENTS

JP  2000-208438 A   7/2000
JP  2006-244688 A  12/2006
(Continued)

OTHER PUBLICATIONS

Notification of Transmittal of Translation of the International Preliminary Report on Patentability (Form PCT/IB/338) of International Application No. PCT/JP2013/057741 mailed Oct. 16, 2014 with Forms PCT/IB/373, PCT/ISA/237 and PCT/IB/326 (13 pages).
(Continued)

*Primary Examiner* — Caleen Sullivan
(74) *Attorney, Agent, or Firm* — Westerman, Hattori, Daniels & Adrian, LLP

(57) ABSTRACT

An ohmic electrode (6) of a silicon carbide semiconductor apparatus is fabricated by forming an ohmic metal film on a silicon carbide substrate (1) by sputtering a target including a mixture or an alloy having therein nickel, and a metal(s) reducing the magnetic permeability of nickel and producing a carbide, where compositional ratios of the mixture or alloy are adjusted to predetermined compositional ratios, and by executing heat treatment for the ohmic metal film to calcinate the ohmic metal film. Thus, the ohmic electrode (6) that is for the silicon carbide semiconductor apparatus and capable of improving the use efficiency of the target can be manufactured, whose film thickness is even and that does not peel off.

7 Claims, 3 Drawing Sheets

(51) Int. Cl.
*H01L 21/285* (2006.01)
*H01L 29/16* (2006.01)
*H01L 29/66* (2006.01)
*H01L 29/872* (2006.01)
*H01L 29/40* (2006.01)
*H01L 29/06* (2006.01)

(52) U.S. Cl.
CPC .......... *H01L21/285* (2013.01); *H01L 21/2855* (2013.01); *H01L 29/1608* (2013.01); *H01L 29/6606* (2013.01); *H01L 29/66143* (2013.01); *H01L 29/872* (2013.01); *H01L 29/0619* (2013.01); *H01L 29/0638* (2013.01); *H01L 29/401* (2013.01)

(56) References Cited

FOREIGN PATENT DOCUMENTS

| | | |
|---|---|---|
| JP | 2011-119585 A | 6/2011 |
| JP | 2011-165880 A | 8/2011 |
| JP | 2011-171551 A | 9/2011 |
| WO | 2011/099338 A1 | 8/2011 |
| WO | 2011/115259 A1 | 9/2011 |

OTHER PUBLICATIONS

International Search Report dated Jun. 25, 2013, issued in corresponding application No. PCT/JP2013/057741.

FABRICATION METHOD OF SILICON CARBIDE SEMICONDUCTOR APPARATUS

TECHNICAL FIELD

The present invention relates to a fabrication method of a silicon carbide semiconductor apparatus and more particularly to a fabrication method of an ohmic electrode of the silicon carbide semiconductor apparatus.

BACKGROUND ART

Improvement of the performance of a power device that uses a silicon (Si) substrate (hereinafter, referred to as "silicon power device") has conventionally been advanced aiming at controlling high frequency and high electric power. However, application of a new semiconductor material is under consideration to meet the demand for a power device with a higher performance consequent to silicon power devices being unusable under a high temperature condition, etc.

Silicon carbide (SiC) has a wide forbidden band width that is about three times as wide as that of silicon and therefore, is excellent in controllability of electrical conductivity at a high temperature; has a breakdown voltage that is higher than that of silicon by about 10-fold; and consequently, is applicable as a substrate material for a high voltage device. Furthermore, silicon carbide has an electron saturation drift velocity that is about two times as high as that of silicon and therefore, is further applicable to a device to control high frequency and high power.

According to a known method concerning a technique of forming a back face electrode of a power device using a silicon carbide substrate, silicon in the silicon carbide substrate and nickel (Ni) in a nickel film are caused to react with each other to form a reaction layer including nickel silicide; and thereby, an ohmic property is acquired between the silicon carbide substrate and the nickel film. With the ohmic electrode formed according to this method, however, free carbon (C) isolated on the surface of the ohmic electrode degrades the adhesiveness between the ohmic electrode and a metal wiring layer formed on the ohmic electrode. Consequently, a problem arises in that the metal wiring layer tends to peel off. To solve this problem, an approach below has been proposed.

For example, Patent Document 1 discloses a method according to which: on the surface of the silicon carbide substrate, a second metal film including any one of titanium (Ti), tantalum (Ta), and tungsten (W) is formed on a first metal film including nickel or a nickel alloy; and heat treatment is executed therefor. Patent Document 1 describes that: according to this method, free carbon generated by the production of a nickel silicide reacts with the second metal film to produce a carbide; therefore, the carbon component can be prevented from being isolated onto the surface of the metal film; and the ohmic electrode and the metal wiring layer can be prevented from peeling off from each other.

Patent Document 1: Japanese Laid-Open Patent publication No. 2006-344688

DISCLOSURE OF INVENTION

Problem to be Solved by the Invention

According to the fabrication method described in Patent Document 1, however, the film thickness ratios of the nickel film and the second metal film require highly precise control to simultaneously prevent the isolation of the free carbon that causes the peeling off and the increase of the contact resistance due to the second metal film remaining in excess. It is known that, with the magnetron sputtering method generally used to form a metal film: leaking lines of the magnetic force in the outer periphery of the target are reduced by repeatedly executing the formation of the film of nickel, which is a ferromagnetic material. Consequently, erosion concentrates at a central portion of the target, whereby the evenness of the film thickness is degraded. The precipitation speed is reduced in the outer circumference of the target while the precipitation speed is increased disproportionately toward the center of the target. Therefore, problems arise in that the life of the target is reduced and that the use efficiency of the target is degraded.

To solve the above problems involved in the traditional techniques, an object of the present invention is to provide a silicon carbide semiconductor apparatus fabrication method that can cause the film thickness of the ohmic electrode to be even in forming the ohmic electrode, that can prevent any peeling off thereof, and that can improve the use efficiency of the target.

Means for Solving Problem

To solve the problems above and achieve an object, a silicon carbide semiconductor apparatus fabrication method according to the present invention has the following characteristics. An ohmic metal film is formed on a silicon carbide substrate by sputtering a target including a mixture or an alloy having therein nickel, and a metal(s) reducing magnetic permeability of nickel and producing a carbide. Compositional ratios of the mixture or the alloy are adjusted to predetermined compositional ratios. Heat treatment for the ohmic metal film to calcinate the ohmic metal film is executed.

To solve the problems above and achieve an object, a silicon carbide semiconductor apparatus fabrication method has the following characteristics. An epitaxial layer is grown on a first principal surface of a silicon carbide substrate. An ohmic metal film is formed on the silicon carbide substrate by sputtering onto a second principal surface of the silicon carbide substrate, a target of a mixture or an alloy having therein nickel and a metal(s) reducing magnetic permeability of nickel and producing a carbide. Compositional ratios of the mixture or the alloy are adjusted to predetermined compositional ratios. Heat treatment for the ohmic metal film to calcinate the ohmic metal film is executed.

In the silicon carbide semiconductor apparatus fabrication method, the metal(s) reducing the magnetic permeability of the nickel and producing the carbide is/are one, or two or more metal(s) selected from among molybdenum, tungsten, tantalum, vanadium, zirconium, titanium, chromium, and aluminum.

In the silicon carbide semiconductor apparatus fabrication method, the metal(s) reducing the magnetic permeability of the nickel and producing the carbide is/are titanium, and a ratio of titanium in the target is 8 at % or greater and 50 at % or less.

In the silicon carbide semiconductor apparatus fabrication method, a temperature at which the heat treatment is executed is 1,050 degrees C. or greater.

According to the present invention, the ohmic electrode whose film thickness is even and that does not peel off can be formed on the silicon carbide substrate. The use efficiency of the target can be improved. According to the present invention: the compositional ratios of nickel and titanium, which are the materials of the ohmic electrode can be controlled precisely; whereby, the precipitation of carbon on the surface of the ohmic electrode layer can be suppressed, this precipitation causes the peeling off of the electrode; and simultaneously, the titanium can be prevented from remaining in excess, which causes the increase of the contact resistance.

Effect of the Invention

According to the silicon carbide semiconductor apparatus fabrication method a according to the present invention, effects are achieved that the film thickness can be made even in forming the ohmic electrode; the ohmic electrode does not peel off; and the use efficiency of the target can be improved.

BEST MODE(S) FOR CARRYING OUT THE INVENTION

Figure 1:
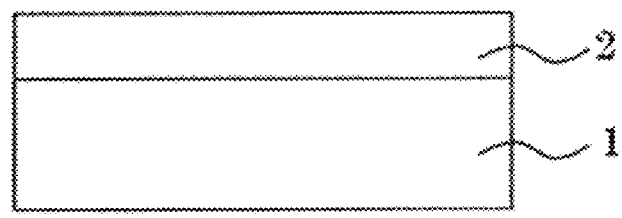
FIG. 1 is a schematic cross-sectional diagram for explaining fabrication process steps of a silicon carbide Schottky barrier diode according to an embodiment of the present invention.

A preferred embodiment of a fabrication method of a silicon carbide semiconductor apparatus according to the present invention will be described below in detail with reference to the accompanying drawings. In the accompanying drawings and herein, the layers and the regions each having "n" or "p" attached at the head thereof mean that the majority carriers of the respective layer and region are electrons or holes. In the description of the embodiment and the accompanying drawings, the same configurations are given the same reference numerals and redundant description will be omitted.

Embodiment

The silicon carbide semiconductor apparatus fabrication method according to the embodiment of the present invention will be described below in detail taking a fabrication method of a silicon carbide Schottky barrier diode as an example.

FIGS. 1, 2, 3, 4, 5, and 6 are schematic cross-sectional diagrams for explaining fabrication process steps of the silicon carbide Schottky barrier diode according to the embodiment of the present invention. As depicted in FIG. 1, a high concentration n-type silicon carbide substrate 1 having a (0001) surface is prepared that is doped with, for example, nitrogen at $1 \times 10^{18}$ cm$^{-3}$ and whose thickness is 350 μm. A low concentration n-type silicon carbide drift layer 2 doped with nitrogen at $8 \times 10^{16}$ cm$^{-3}$ is deposited to have a thickness of 6 μm on a first principal surface of the high concentration n-type silicon carbide substrate 1.

Figure 2:
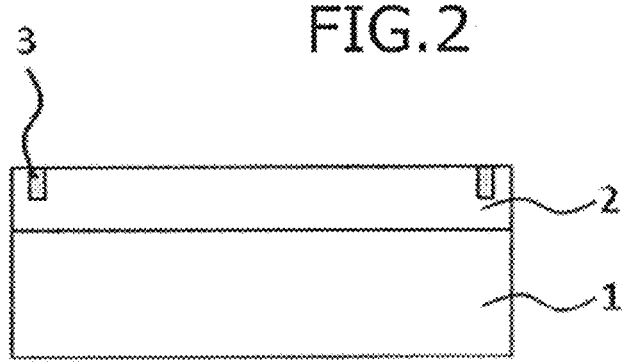
FIG. 2 is a schematic cross-sectional diagram for explaining fabrication process steps of the silicon carbide Schottky barrier diode according to the embodiment of the present invention.
Figure 3:
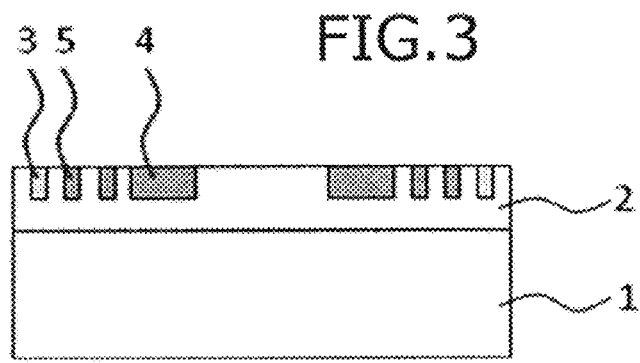
FIG. 3 is a schematic cross-sectional diagram for explaining fabrication process steps of the silicon carbide Schottky barrier diode according to the embodiment of the present invention.

As depicted in FIG. 2, for example, phosphorus (P) is injected into the low concentration n-type silicon carbide drift layer 2 using, for example, an ion implantation method to form a channel stopper n-type region 3 therein. As depicted in FIG. 3, for example, aluminum (Al) is injected into the low concentration n-type silicon carbide drift layer 2 using the ion implantation method to form therein a p-type region 4 for a termination structure and a p-type region 5 for a field limiting ring (FLR) structure. An activation process is executed, for example, for 240 seconds at a temperature of 1,650 degrees C. in an argon (Ar) atmosphere to activate the phosphorus injected to form the channel stopper n-type region 3 and the aluminum injected to form the p-type region 4 for the termination structure and the p-type region 5 for the FLR structure.

Figure 4:
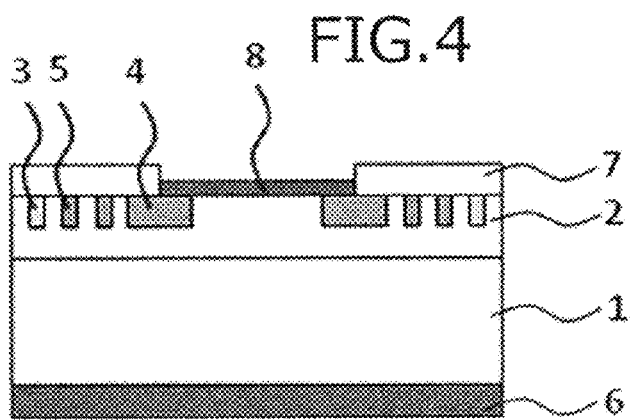
FIG. 4 is a schematic cross-sectional diagram for explaining fabrication process steps of the silicon carbide Schottky barrier diode according to the embodiment of the present invention.

As depicted in FIG. 4, a first metal film is deposited to have a thickness of 80 μm on a second principal surface of the high concentration n-type silicon carbide substrate 1 by sputtering a sputtering target made from a mixture or an alloy including nickel and titanium at the ratios of nickel:titanium=80:20 (at %) in a vacuum using a magnetron sputtering method.

Thereafter, using a rapid thermal annealing (RTA) apparatus, the temperature is increased at a temperature increase speed of, for example, 1 degree C./second and after the temperature reaches a temperature equal to or higher than 1,050 degrees C. such as, for example, 1,100 degrees C., this temperature is maintained for two minutes. Thereby, the first metal layer is calcinated and reacts with silicon in the high concentration n-type silicon carbide substrate 1 to form a silicide and thereby, a low resistance ohmic electrode 6 is formed on the second principal surface of the high concentration n-type silicon carbide substrate 1.

An interlayer insulating film 7 is formed on the first principal surface of the high concentration n-type silicon carbide substrate 1. Patterning is executed for the interlayer insulating film 7 to form a contact hole that opens for a portion to form therein a Schottky electrode 8. A second metal layer is formed by vapor-depositing, for example, titanium onto the portion to form therein the Schottky electrode 8 and thereafter, the temperature is increased at a faster temperature increase rate of, for example, 8 degrees C./second and, after the temperature reaches 500 degrees C., this temperature is maintained for five minutes to form the Schottky electrode 8. The termination portion of the Schottky electrode 8 is formed to extend on the p-type region 4 to cause the Schottky barrier diode to operate as a high voltage device, and an end of the Schottky electrode 8 and the p-type region 4 are caused to overlap with each other.

Figure 5:
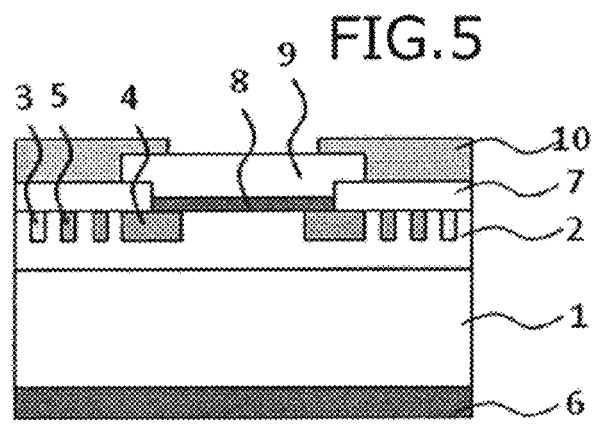
FIG. 5 is a schematic cross-sectional diagram for explaining fabrication process steps of the silicon carbide Schottky barrier diode according to the embodiment of the present invention.

As depicted in FIG. 5, on the Schottky electrode 8, an electrode pad 9 including, for example, aluminum and silicon is formed to have a thickness of, for example, 5 μm as a bonding electrode pad, and a passivation film 10 including polyimide is formed spanning from the interlayer insulating layer 7 to the electrode pad 9.

Although not depicted, contaminants such as, for example, the residue of the photoresist adhere to the surface of the ohmic electrode 6 during the many process steps executed so far. The contaminants can be removed by processing the back face using a counter-sputtering method of removing impurities by causing ionized argon to collide against the contaminants.

Figure 6:
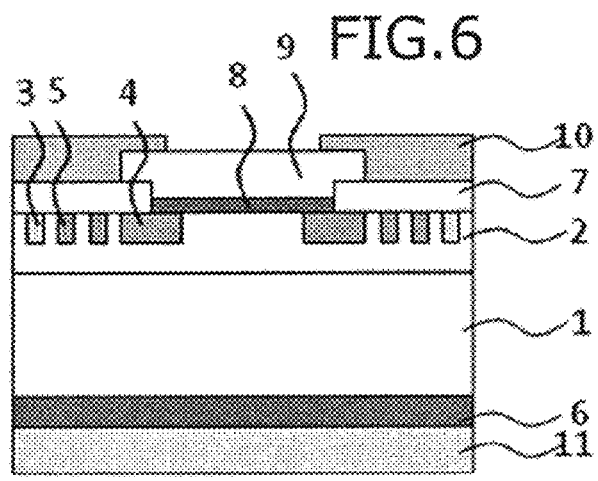
FIG. 6 is a schematic cross-sectional diagram for explaining fabrication process steps of the silicon carbide Schottky barrier diode according to the embodiment of the present invention.

As depicted in FIG. 6, a gold (Au) film is formed on the ohmic electrode 6 to have a thickness of, for example, 200 nm. Thereby, an external electrode 11 is formed that does not peel off and whose resistance is low, to connect the semiconductor apparatus to an external apparatus.

An anti-peeling-off durability test was conducted for silicon carbide Schottky barrier diodes manufactured using the silicon carbide semiconductor apparatus fabrication method according to the embodiment depicted in FIGS. 1 to 6 and by varying the ratio of titanium to nickel in the ohmic electrode 6 in a range from zero to 60 at % (hereinafter, each referred to as "example").

Figure 7:
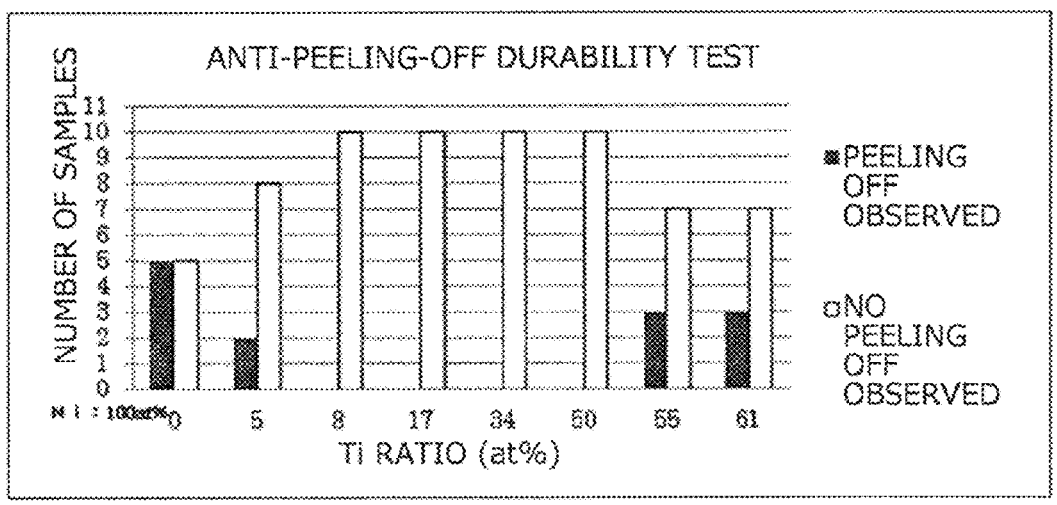
FIG. 7 is a chart presenting the relation between the rate of the ratio of titanium to nickel in an ohmic electrode and the adhesiveness of an electrode film, according to the embodiment of the present invention.

For example, 10 silicon carbide Schottky barrier diodes were prepared for each condition of the ratio of titanium to nickel in the ohmic electrode 6, and a test was conducted for each of the 10 silicon carbide Schottky barrier diodes for 10 sessions, each conducted by: causing a strip of Scotch tape to adhere to the surface of the external electrode 11 of the diode to cover the surface; and thereafter, peeling off the external electrode 11 using the strip of Scotch tape. The results of the test are depicted in FIG. 7. FIG. 7 is a chart presenting the relation between the rate of the ratio of titanium to nickel in the ohmic electrode and the adhesiveness of the electrode film, according to the examples of the present invention. As can be seen from FIG. 7, the external electrodes 11 did not peel off for the silicon carbide Schottky barrier diodes whose ratios of titanium to nickel in the ohmic electrodes 6 are 8 to 50 at %.

Figure 8:
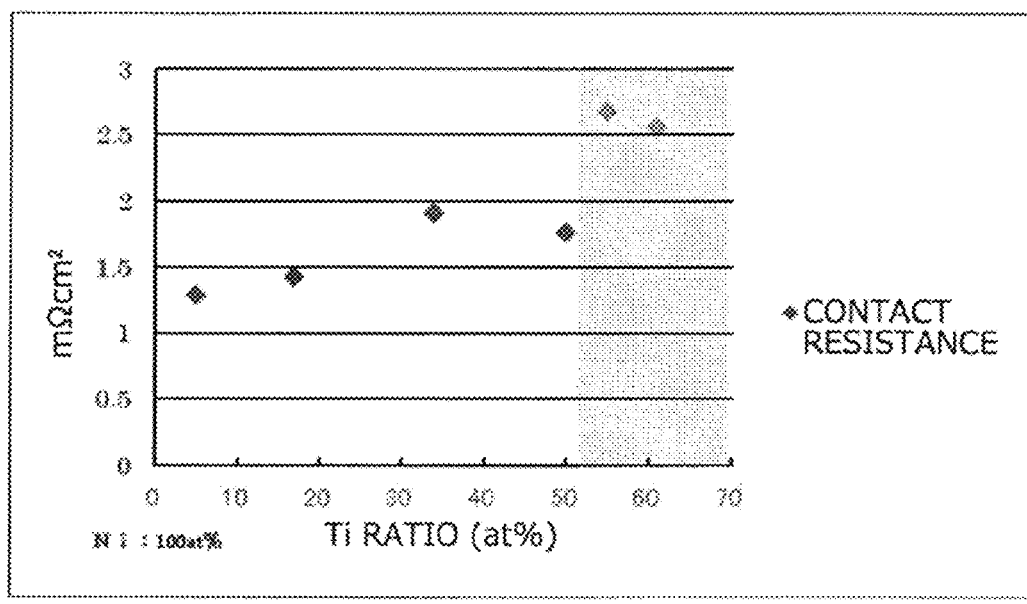
FIG. 8 is a chart presenting the relation between the rate of the ratio of titanium to nickel in the ohmic electrode and contact resistance, according to the embodiment of the present invention.

The contact resistance was measured for each of the silicon carbide Schottky barrier diodes fabricated using the fabrication method of a silicon carbide semiconductor apparatus according to the embodiment depicted in FIGS. 1 to 6 and varying the ratio of titanium to nickel in the ohmic electrode 6 in a range from zero to 60 at %. The result of the measurement is depicted in FIG. 8. FIG. 8 is a chart presenting the relation between the rate of the ratio of titanium to nickel in the ohmic electrode and the contact resistance, according to the examples of the present invention. As can be seen from FIG. 8, the contact resistance increased when the ratio of titanium to nickel in the ohmic electrode 6 exceeded 50 at %.

As described, use of the target whose nickel:titanium compositional ratios are adjusted to predetermined nickel:titanium compositional ratios enables precise control of the nickel:titanium compositional ratios of the material of the ohmic electrode. Therefore, any precipitation of carbon on the surface of the ohmic electrode layer can be suppressed, this precipitation causing the peeling off of the electrode. Any increase of the contact resistance can be suppressed, the increase being caused by titanium remaining in excess on the surface of the ohmic electrode layer.

The fabrication process steps of the silicon carbide Schottky barrier diode disclosed with reference to FIGS. 1 to 6 are exemplified for understanding of the present invention of the present application and, needless to say, the fabrication conditions disclosed herein can be changed arbitrarily. In the embodiment, the description has been made taking the example of the (0001) surface as the principal surface of the high concentration n-type silicon carbide substrate. However, a (000-1) surface may be used as the principal surface of the high concentration n-type silicon carbide substrate.

In the embodiment, a case has been described where the silicon carbide Schottky barrier diode is fabricated. However, the present invention is applicable to the fabrication of an ohmic electrode of a silicon carbide semiconductor apparatus whose high concentration n-type silicon carbide substrate principal surface has another semiconductor apparatus formed thereon such as a MOS gate (an insulating gate including a metal, an oxide film, and a semiconductor) structure.

The silicon carbide Schottky barrier diode has been exemplified herein as the embodiment and each of the examples, and the fabrication method thereof has been described in detail. However, the present invention is not limited to the embodiment and each of the examples, and various design changes can be made thereto without departing from the spirit of the present invention.

For example, in the examples, the target has been exemplified that is formed by adding titanium to nickel that is a ferromagnetic material to reduce the magnetic permeability as the sputtering target. However, the magnetic permeability may be reduced by adding another material such as molybdenum (Mo), tungsten, tantalum, vanadium (V), zirconium (Zr), chromium (Cr), or aluminum to nickel that is a ferromagnetic material. Two or more of these materials may also be added in combination.

As described, according to the present invention, use of the sputtering target whose magnetic permeability is reduced by adding one or more of titanium, molybdenum, tungsten, tantalum, vanadium, zirconium, chromium, and aluminum to nickel, which is a ferromagnetic material to reduce the magnetic permeability enables reduction of the disproportionate degradation of the target, improvement of the evenness of the ohmic electrode layer, and simultaneously, improvement of the use efficiency of the target.

INDUSTRIAL APPLICABILITY

As described, the fabrication method of a silicon carbide semiconductor apparatus according to the present invention is useful for a power semiconductor apparatus to be used under a high temperature condition and to control high frequency and high power.

EXPLANATIONS OF LETTERS OR NUMERALS 1 high concentration n-type silicon carbide substrate
2 low concentration n-type silicon carbide drift layer
3 n-type region
4 p-type region (termination)
5 p-type region (FLR)
6 ohmic electrode
7 interlayer insulating layer
8 Schottky electrode
9 electrode pad
10 passivation film
11 external electrode

The invention claimed is:
1. A silicon carbide semiconductor apparatus fabrication method comprising:
   forming an ohmic metal film on a silicon carbide substrate by sputtering a target including a mixture or an alloy having therein nickel, and a metal(s) reducing magnetic permeability of nickel and producing a carbide, compositional ratios of the mixture or the alloy being adjusted to predetermined compositional ratios; and
   executing heat treatment for the ohmic metal film to calcinate the ohmic metal film, wherein
   the metal(s) reducing the magnetic permeability of the nickel and producing the carbide is titanium, and a ratio of titanium in the target is 8 at % or greater and 50 at % or less.

2. The silicon carbide semiconductor apparatus fabrication method according to claim 1, wherein
a temperature at which the heat treatment is executed is 1,050 degrees C. or greater.

3. A silicon carbide semiconductor apparatus fabrication method comprising:
growing an epitaxial layer on a first principal surface of a silicon carbide substrate;
forming an ohmic metal film on the silicon carbide substrate by sputtering a target comprising a mixture or an alloy having therein nickel and a metal(s) reducing magnetic permeability of nickel and producing a carbide, compositional ratios of the mixture or alloy being adjusted to predetermined compositional ratios, onto a second principal surface of the silicon carbide substrate; and
executing a heat treatment for the ohmic metal film to calcinate the ohmic metal film.

4. The silicon carbide semiconductor apparatus fabrication method according claim 3, wherein
the metal(s) reducing the magnetic permeability of the nickel and producing the carbide is/are one, or two or more metal(s) selected from among molybdenum, tungsten, tantalum, vanadium, zirconium, titanium, chromium, and aluminum.

5. The silicon carbide semiconductor apparatus fabrication method according to claim 3, wherein
the metal(s) reducing the magnetic permeability of the nickel and producing the carbide is/are titanium, and
a ratio of titanium in the target is 8 at % or greater and 50 at % or less.

6. The silicon carbide semiconductor apparatus fabrication method according to claim 3, wherein
a temperature at which the heat treatment is executed is 1,050 degrees C. or greater.

7. A silicon carbide semiconductor apparatus fabrication method comprising:
forming an ohmic metal film on a silicon carbide substrate by sputtering a target including a mixture or an alloy having therein nickel, and a metal(s) reducing magnetic permeability of nickel and producing a carbide, compositional ratios of the mixture or the alloy being adjusted to predetermined compositional ratios; and
executing heat treatment for the ohmic metal film to calcinate the ohmic metal film, wherein
the metal(s) reducing the magnetic permeability of the nickel and producing the carbide is/are one, or two or more metal(s) selected from among molybdenum, tungsten, tantalum, vanadium, zirconium, titanium, chromium, and aluminum, and
a ratio of said one, or two or more selected metal(s) in the target is 8 at % or greater and 50 at % or less.

* * * * *